(12) United States Patent  
Falk

(10) Patent No.: US 11,195,960 B2  
(45) Date of Patent: Dec. 7, 2021

(54) SOLAR MODULE, PHOTOVOLTAIC SYSTEM, AND VOLTAGE LIMITATION METHOD

(71) Applicant: SMA Solar Technology AG, Niestetal (DE)

(72) Inventor: Andreas Falk, Kassel (DE)

(73) Assignee: SMA SOLAR TECHNOLOGY AG, Niestetal (DE)

(*) Notice: Subject to any disclaimer, the term of this patent is extended or adjusted under 35 U.S.C. 154(b) by 39 days.

(21) Appl. No.: 16/361,660

(22) Filed: Mar. 22, 2019

(65) Prior Publication Data

US 2019/0221681 A1  Jul. 18, 2019

Related U.S. Application Data

(63) Continuation of application No. PCT/EP2017/073467, filed on Sep. 18, 2017.

(30) Foreign Application Priority Data

Sep. 23, 2016  (DE) .................. 102016118039.4

(51) Int. Cl.
  *H01L 31/02* (2006.01)
  *H01L 31/044* (2014.01)
  *H01L 31/05* (2014.01)

(52) U.S. Cl.
  CPC ...... *H01L 31/02021* (2013.01); *H01L 31/044* (2014.12); *H01L 31/0504* (2013.01); *Y02E 10/50* (2013.01)

(58) Field of Classification Search
  None
  See application file for complete search history.

(56) References Cited

U.S. PATENT DOCUMENTS

| 4,580,090 A * | 4/1986 | Bailey ................... H02M 3/156 |
| | | 323/303 |
| 4,661,758 A * | 4/1987 | Whittaker ................. H02J 7/35 |
| | | 320/101 |
| 7,924,582 B2 | 4/2011 | Mueller et al. |
| 9,190,996 B2 | 11/2015 | Chaintreuil |
| 10,211,631 B2 | 2/2019 | Ponec et al. |
| 2010/0127571 A1 | 5/2010 | Hadar |

(Continued)

FOREIGN PATENT DOCUMENTS

| CN | 102867712 A * | 1/2013 |
| DE | 102011079074 A1 | 1/2013 |
| DE | 102012218366 B3 | 2/2014 |

OTHER PUBLICATIONS

Partial translation of CN 102867712 A (Year: 2020).*
International Search Report dated Nov. 17, 2017 in connection with International Application PCT/EP2017/073467.

*Primary Examiner* — Magali P Slawski
(74) *Attorney, Agent, or Firm* — Eschweiler & Potashnik, LLC

(57) ABSTRACT

A solar module includes a series circuit of solar cells, a switch arranged in parallel with a section of the series circuit, and an actuation circuit. The actuation circuit is operably coupled to the switch, and is configured to actuate the switch in a clocked manner with a duty cycle, wherein the duty cycle is based on a voltage dropped across the series circuit or across a portion of the series circuit.

6 Claims, 5 Drawing Sheets

(56) References Cited

U.S. PATENT DOCUMENTS

2012/0200311 A1\* 8/2012 Chaintreuil ....... H01L 31/02021
                                                          324/761.01
2012/0253541 A1 10/2012 Arditi
2012/0313440 A1 12/2012 Watelmacher
2015/0207017 A1 7/2015 Eickelmann et al.

\* cited by examiner

S OLAR MODULE, PHOTOVOLTAIC SYSTEM, AND VOLTAGE LIMITATION METHOD

CROSS REFERENCE TO RELATED APPLICATIONS

This application is a continuation of International Patent Application number PCT/EP2017/073467, filed on Sep. 18, 2017, which claims priority to German Patent Application number 102016118039.4, filed on Sep. 23, 2016, and is hereby incorporated by reference in its entirety.

FIELD

The disclosure relates to a solar module, to a photovoltaic installation (PV installation) comprising a series circuit of solar modules, and to a method for voltage limitation at a solar module.

BACKGROUND

For the economical generation of electrical energy with the aid of PV modules, the PV modules are connected to form strings of increasingly great length. In order to make the string voltage, which rises on account of the growing string length, manageable, safety circuits are required, which protect a connected inverter from overvoltages and make disconnection of the inverter from the string for protection from the overvoltage unnecessary.

As an alternative to disconnection of the string from the inverter, document DE102010009120 A1 proposes short-circuiting a portion of the string by means of a switch when the string voltage exceeds a critical value. As a result of this, the remaining string can continue to be connected to the inverter and the photovoltaic installation can continue to produce energy. However, this solution causes an increased level of outlay owing to the provision of the additional short-circuit path and the actuation thereof.

Voltage-reducing short-circuiting means can also, however, be integrated into PV modules according to document WO2015/095414, as a result of which additional cabling outlay is avoided. The short-circuiting means can short-circuit a respective submodule in the case of overvoltage and thus reduce the voltage at connection terminals of the solar module, for example, to 75% of the entire voltage.

It would be desirable to configure the voltage limitation of a solar module to be continuous so that, when an overvoltage occurs, the voltage is decreased only as far as necessary and the energy generation of the solar module is restricted only as little as required.

SUMMARY

The present disclosure is directed to solar modules for strings that autonomously ensure observation of voltage limits with minimal detriment to the energy generation with the aid of protective circuitry, without additional cabling outlay of the string being necessary.

In one embodiment, the disclosure relates to a solar module, which comprises a series circuit of solar cells, a switch, which is arranged in parallel with a section of the series circuit, and an actuation circuit for actuating the switch. The actuation circuit is configured to actuate the switch in a clocked manner with a duty cycle, wherein the duty cycle is determined based on a voltage dropped across the series circuit or across a portion of the series circuit. By way of the clocked actuation, the voltage of the solar module is reduced in a first period, and the solar module supplies a non-limited voltage in a second period. The duty cycle therefore determines a ratio between the lengths of the first and second period and, as a result thereof, the mean value of the voltage supplied by the solar module over time. Even if the voltage of the solar module jumps back and forth between two values, only a slight variation of the string voltage over time is achieved by superposing the voltage jumps by using several similar solar modules according to the disclosure in a string. To this end, the actuation circuits of the solar modules are, in one embodiment, operated in an asynchronous manner in order to distribute the switching times of the switches over the time as equally as possible. This can be achieved, for example, by virtue of the actuation circuit being configured to vary the frequency of the clocked actuation, in particular to vary the frequency in a statistical manner. For example, varying the frequency in a statistical manner can be achieved by a random number generator for generating the frequency within the actuation circuit. In one embodiment of the disclosure, varying the frequency in a statistical manner means that a variation of the actuation timing of the actuation circuit has no correlation to the actuation timing of actuation circuits of other solar modules within the same string. In this way the voltage of a whole string having multiple such solar modules will have a Gaussian probability distribution.

The section of the series circuit is, in one embodiment, the entire series circuit of the solar cells, with the result that a maximum possible voltage limitation is made possible. However, only a subregion of the series circuit of the solar cells can also form the section, for example, one or two of three submodules of the solar module.

The actuation circuit is, in one embodiment, configured to determine the voltage across the portion of the series circuit when the switch is open. As a result thereof, the measured voltage is not adversely affected by the voltage decrease caused by the closure of the switch and the measurement result is independent of the duty cycle used.

In one embodiment of the disclosure, the solar module comprises a circuit breaker, which, when opened, electrically isolates the section of the series circuit from terminals of the solar module. The circuit breaker is, in one embodiment, arranged at one end of the section of the series circuit bypassed by the switch. In particular, a terminal of the circuit breaker is connected both to a terminal of the switch and to a terminal of the solar module. The circuit breaker is connected by way of the other end to the series circuit of the solar cells. The actuation circuit can be configured to open the circuit breaker in a clocked manner together with the clocked actuation of the switch, wherein the circuit breaker is opened before the switch is closed and is closed after the switch is opened. As a result thereof, discharging of a capacitance associated with the series circuit of solar cells when the switch is closed is avoided. Such discharging leads to undesired thermal loading of the switch, in particular at a high switching frequency.

The switch and the circuit breaker are, in one embodiment, configured as semiconductor switches, for example as IGBTs or MOSFETs, and can have an intrinsic or a separate freewheeling diode. With respect to the terminals of the solar module, the freewheeling diode of the switch is oriented in parallel with the bypass diode and the freewheeling diode of the circuit breaker is oriented in antiparallel.

The actuation circuit, the switch and the circuit breaker can, in one embodiment, be housed in a junction box of the solar module. Energy is supplied to the actuation circuit from the series circuit of the solar cells or a portion thereof in one embodiment.

In a further embodiment of the disclosure, a photovoltaic installation comprises a plurality of solar modules interconnected in series and/or in parallel, of which at least a proportion are solar modules according to the disclosure. A design of the photovoltaic installation exclusively using solar modules according to the disclosure is also conceivable. When only some of the solar modules are solar modules according to the disclosure, and the photovoltaic installation comprises parallel strings, the proportion of solar modules according to the disclosure in the strings should be selected to be equal in order to prevent return currents in individual strings on account of uneven voltage reduction.

A photovoltaic installation according to the disclosure can furthermore comprise an inverter, which is configured to detect the clocked actuation of switches of the solar modules according to the disclosure as a frequency signal on a connection line for the plurality of solar modules. Such a frequency signal is an indication of an ascertained overvoltage in subregions of the photovoltaic installation. In particular, the inverter can be configured to shift an operating point of the plurality of solar modules, for example to an operating point with a higher current or lower voltage on the connection line, in response to detection of the frequency signal, in order to thus counteract an overvoltage ascertained by solar modules. In particular, the voltage of the operating point can be reduced in steps or continuously until the frequency signal disappears.

An additional embodiment of the disclosure relates to a method for voltage limitation at a solar module comprising a series circuit of solar cells, wherein a switch is arranged in parallel with a section of the series circuit. The method comprises determining a voltage across a portion of the series circuit and determining a duty cycle depending on the voltage, and clocked actuation of the switch with the determined duty cycle. The voltage across the entire section of the series circuit with which the switch is connected in parallel is preferably determined. To prevent the closure of the switch from influencing the voltage determination, the voltage is determined when the switch is open.

In another embodiment a circuit breaker is provided and is configured such that, when opened, the circuit breaker electrically isolates the section of the series circuit from one of the terminals of the solar module, wherein the circuit breaker is opened in a clocked manner together with the clocked actuation of the switch and the circuit breaker is opened before the switch is closed and is closed after the switch is opened. As already described, loading of the switch due to the repeated discharging of the capacitance of the series circuit section is prevented as a result.

In one embodiment, at a determined voltage below a prescribed voltage limit value, the determined duty cycle is zero so that the switch is not operated in a clocked manner. Above the voltage limit value, the duty cycle has a minimum value of at least 5%, preferably at least 10%. As the voltage increases, the duty cycle can then increase further up to a maximum value, which may be 100%, but can also be selected to be lower, for example to 95%. If 100% is selected as the maximum value, it should nevertheless be ensured and taken into account that the switch is briefly opened repeatedly at least to determine the voltage across the section of the series circuit.

To achieve a low ripple of the voltage within the photovoltaic installation, a high clock frequency is advantageous. It has been shown that, for example, a clock frequency of 2 kHz is sufficient to achieve even a low residual fluctuation of the input voltage of the inverter in the case of conventionally used link circuit capacitances within the inverter. On the other hand, the lowest possible clock frequency leads to low switching losses, since, when the switch is closed in one solar module, the operating points of the other solar modules of the string change according to the voltage reduction in the one solar module. The change in the operating points of the other solar modules leads to a charge reversal of the generator capacitance linked to the solar cells of said solar modules and hence to additional power losses. A compromise between these losses and the remaining voltage ripple is typically achieved in a range of the clock frequency between 200 Hz and 2 kHz.

In order to minimize the concurrence of the switching processes of the switch with other switches in other solar modules according to the disclosure and to instead achieve the most even distribution possible of the switching times, the frequency of the clocked actuation can be varied, for example, varied in a statistical manner. Statistical variation of the frequency can be achieved in one embodiment by a random number generator as part of the actuation circuit.

BRIEF DESCRIPTION OF THE DRAWINGS

In the following text, the disclosure is illustrated with the aid of figures, in which.

DETAILED DESCRIPTION

Figure 1:
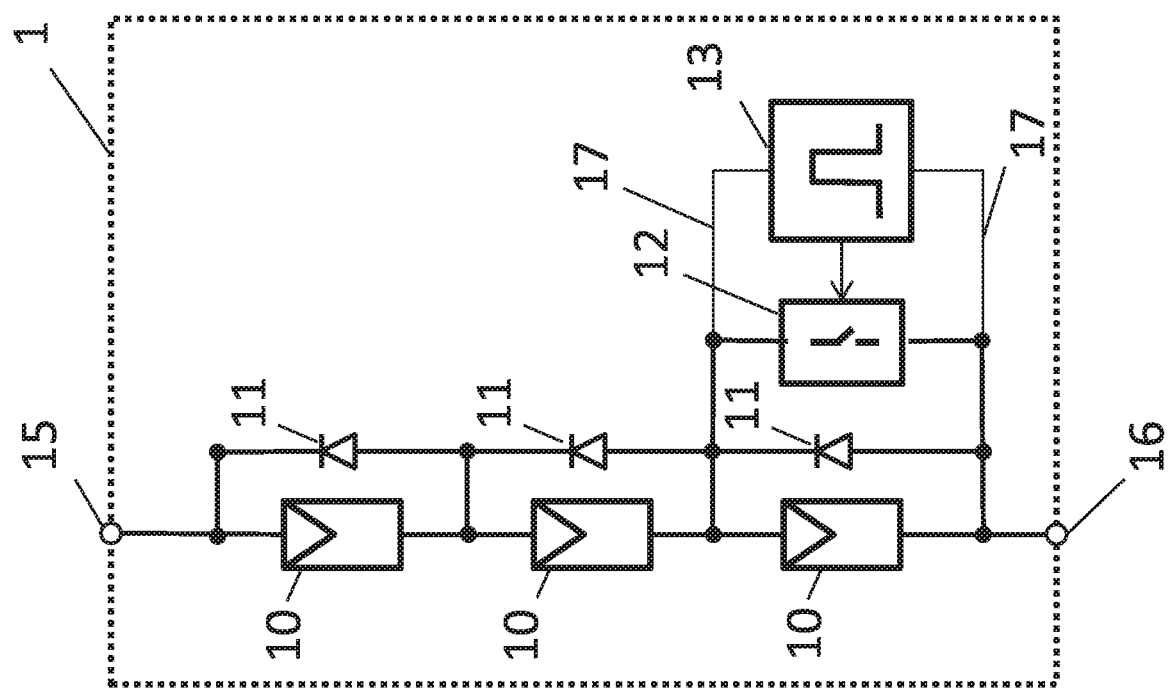
FIG. 1 shows an embodiment according to the disclosure of a solar module.

FIG. 1 shows a solar module 1 according to the disclosure comprising a first terminal 15 and a second terminal 16. A series circuit of solar cells 10, with which a respective bypass diode 11 is connected in parallel in sections, is arranged between the terminals 15, 16. A switch 12 is furthermore connected in parallel with a section of the solar cells 10, for example with one of three submodules, from which the solar module 1 is formed, the switch bypassing the section of the solar cells 10 when an actuation circuit 13 closes the switch 12, that is to say switches on the switch. The actuation circuit 13 is configured to actuate the switch 12 in a clocked manner with a duty cycle, wherein the duty cycle is determined depending on a voltage applied to inputs 17 of the actuation circuit 13. The inputs 17 are connected to the series circuit of solar cells 10 in such a way that they detect the voltage across a portion of the solar cells 10. As shown here, the portion can be identical to the section of the solar cells 10, but can also detect the voltage across another portion of the series circuit of the solar cells 10 or even across the entire series circuit. The voltage can be detected in a manner coordinated in terms of time with the clocking of the switch 12, in particular it can be detected when the switch 12 is open.

The actuation circuit 13 advantageously draws the electrical energy required for operation likewise via the inputs 17, that is to say from the portion of the series circuit to which the inputs 17 are connected. As a result thereof, no further energy source is required for the actuation circuit.

Figure 2:
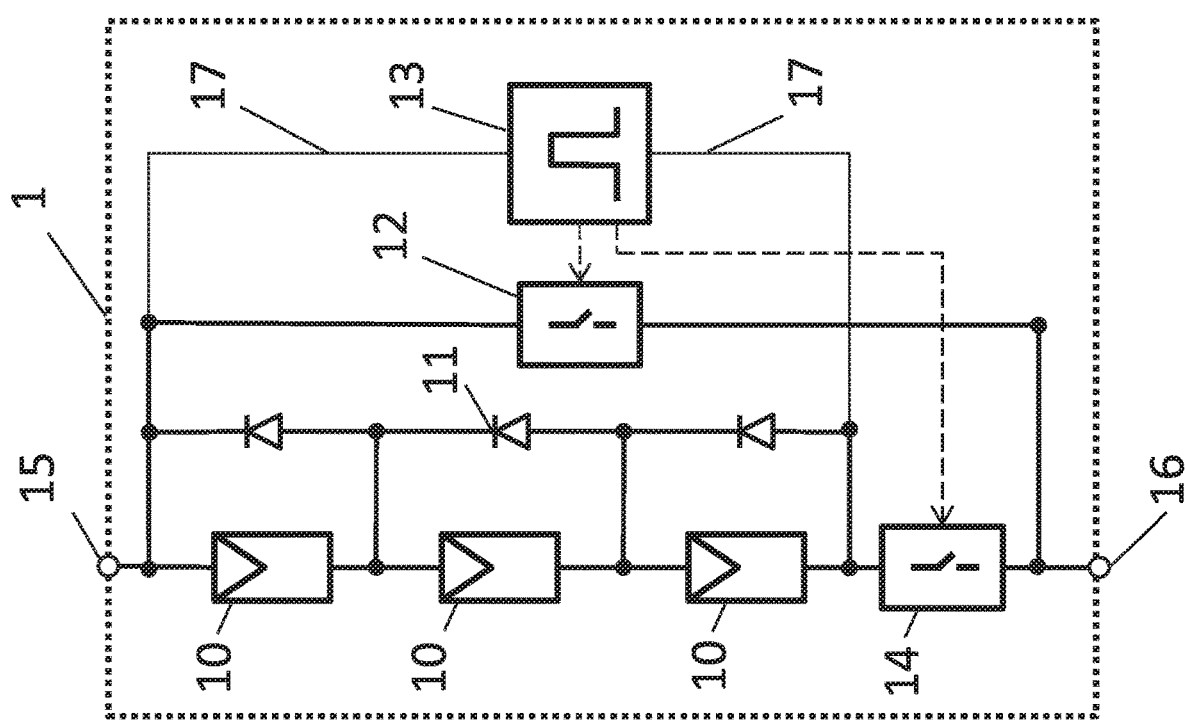
FIG. 2 shows a further embodiment according to the disclosure of a solar module.

The embodiment of a solar module 1 according to the disclosure shown in FIG. 2 initially differs from the solar module 1 from FIG. 1 in that the switch 12 is now arranged in parallel with the entire series circuit of solar cells 10 and hence bypasses the entire solar module 1. Furthermore, the series circuit of solar cells 10 has been supplemented with a circuit breaker 14, which is likewise actuated by the actuation circuit 13. The circuit breaker 14 is arranged in principle at any location in the section of the series circuit of solar cells 10 bypassed by the switch 12; in this case it is connected directly to the terminal 16 of the solar module 1.

Figure 3:
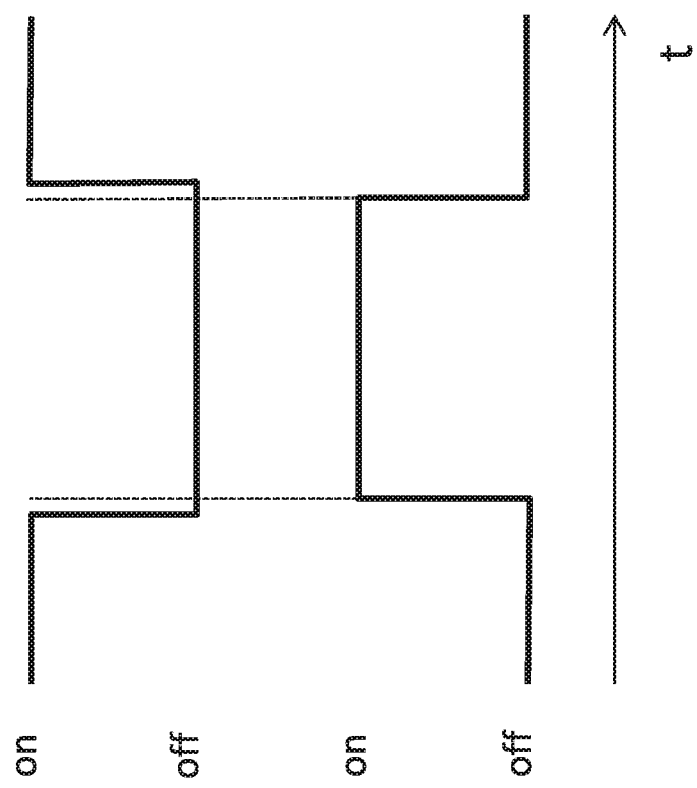
FIG. 3 shows a time profile of switching processes of switches used in the solar module according to the disclosure.

In one embodiment, the circuit breaker 14 is operated in a clocked manner together with the switch 12 by the actuation circuit 13, wherein the circuit breaker 14 is opened before the switch 12 is closed and is closed again after the switch 12 is opened. That is to say the circuit breaker 14 is open during the entire time in which the switch 12 bypasses the section of the series circuit of the solar cells 10. This circumstance is illustrated in the switching profile in FIG. 3. The top diagram shows the time profile of the switching states of the circuit breaker 14 and the bottom diagram shows the time profile of the switching states of the switch 12.

The use of the circuit breaker 14 is particularly advantageous when the series circuit of solar cells 10 has a high capacitance, which would discharge when the switch 12 is closed by means thereof and would lead to a significant thermal loading of the switch, which is prevented by opening the circuit breaker 14.

Figure 4:
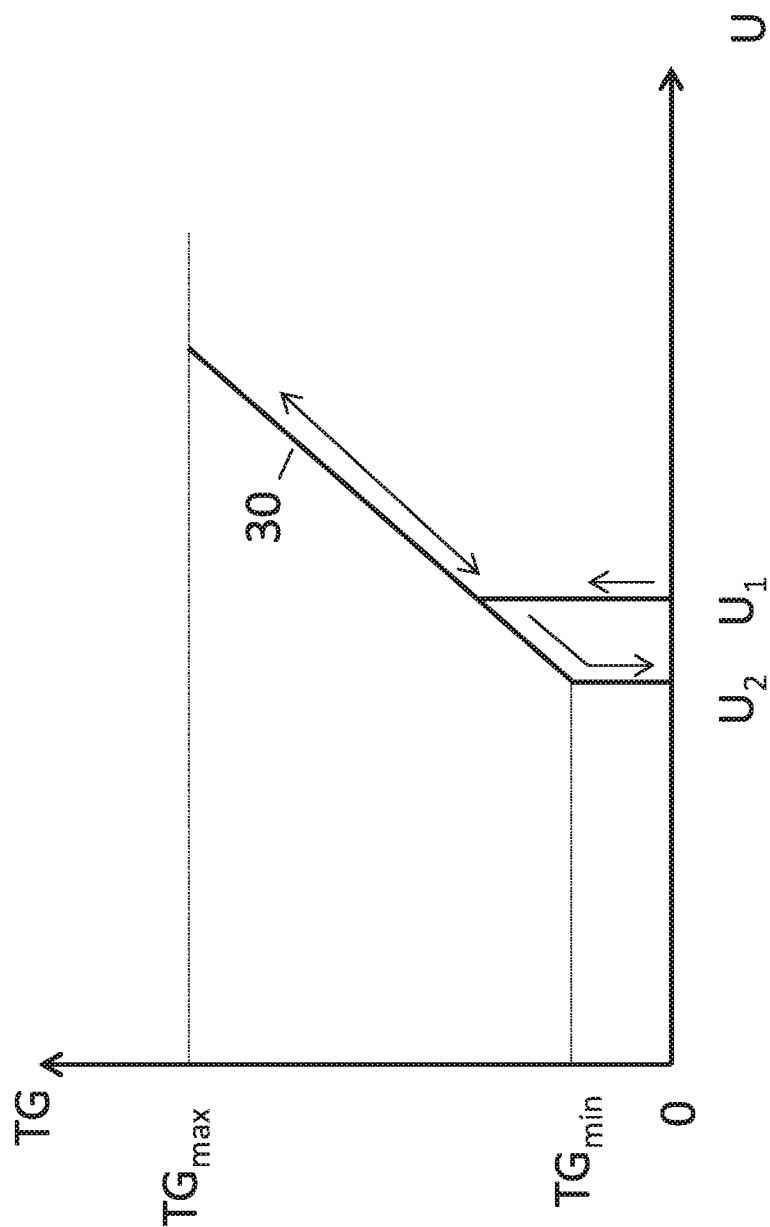
FIG. 4 shows a graph for illustrating the determination of a duty cycle depending on a voltage.

FIG. 4 illustrates how the actuation circuit 13 determines the duty cycle to be used on the ordinate from the voltage at the portion of the series circuit of the solar cells 10 on the abscissa of the graph, which portion of the series circuit is connected to the inputs 17 of the actuation circuit 13. Below a first threshold value U1 of the voltage, the duty cycle is zero, that is to say the switch 12 remains permanently open and the circuit breaker 14, if present, remains closed. When the first threshold value U1 is reached, a clocked operation of the switch 12 and of the circuit breaker 14 begins with a duty cycle greater than or equal to a minimum duty cycle TGmin. Above the first threshold value U1, the duty cycle is selected based on a prescribed characteristic curve 30 and can increase up to a maximum duty cycle TGmax, for example 95%. FIG. 4 shows a linear characteristic curve 30, but another characteristic curve, in particular a monotonically increasing characteristic curve, can also be used. The characteristic curve 30 reaches the minimum duty cycle TGmin, for example 5%, at a second threshold value U2. The second threshold value U2 is lower than or equal to the first threshold value U1. If the voltage at the inputs 17 of the actuation circuit 13 falls below the second threshold value U2, a duty cycle of zero is applied again, that is to say the clocked operation of the switch 12 ends. It is also possible to set the minimum duty cycle to be equal to zero or to select it according to the minimum possible pulse width of the switch 12.

Figure 5:
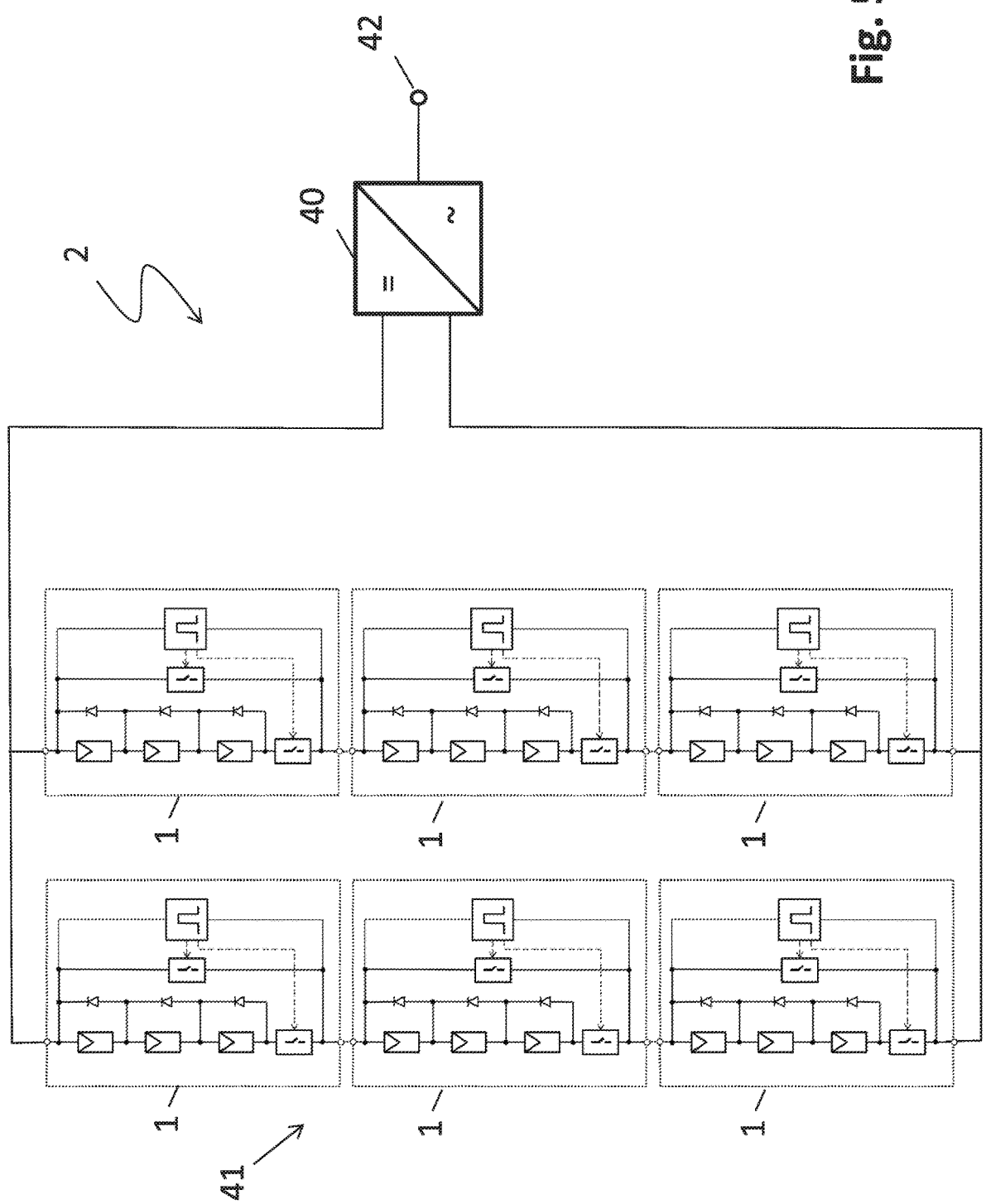
FIG. 5 shows a photovoltaic installation using the solar modules according to the disclosure.

FIG. 5 shows the use of the solar modules according to the disclosure as parts of a photovoltaic installation 2. The solar modules 1 are interconnected in series as a string 41, wherein a plurality of strings 41 can be connected in parallel with one another between connection lines to an inverter 40. The inverter 40 converts the DC power generated by the strings 41 to an AC power for feeding into a grid connected to a grid connection point 42. The maximum string voltage is limited by using the solar modules 1 according to the disclosure independently of the solar modules by virtue of them automatically reducing their voltage by the clocked operation of the switch 12 and circuit breaker 14 in the case of a voltage above the first threshold value U1. As a result thereof, it is possible to extend a length of the string or strings 41 in such a way that the maximum theoretical open-circuit voltage, that is to say the open-circuit voltage without clocked operation of the switches, of the string or strings 41 goes beyond the maximum input voltage of the inverter 40. This is possible because the solar modules 1 prevent the maximum open-circuit voltage from being reached owing to the use of the disclosure. A more cost-effective photovoltaic installation 2 is made possible owing to the increased string length.

The invention claimed is:

1. A solar module having terminals, comprising:
a series circuit of a plurality of series-connected solar cells;
a switch arranged in parallel by itself with a first section of the series circuit, wherein the first section of the series circuit is the entire series circuit of the plurality of series-connected solar cells connected in series with a circuit breaker; and
an actuation circuit operably coupled to the switch, wherein the actuation circuit is configured to actuate the switch in a clocked manner with a duty cycle, wherein the duty cycle is based on a voltage dropped across the series circuit or across a second section of the series circuit, wherein the second section of the series circuit is less than the entire series circuit of the plurality of series-connected solar cells,
wherein the circuit breaker is configured such that, when opened, the circuit breaker electrically isolates the first section of the series circuit from one of the terminals of the solar module.

2. The solar module as claimed in claim 1, wherein the actuation circuit is configured to open the circuit breaker in a clocked manner together with a clocked actuation of the switch, wherein the circuit breaker is opened via the actuation circuit before the switch is closed, and is closed after the switch is opened.

3. The solar module as claimed in claim 1, wherein the actuation circuit is configured to determine the voltage when the switch is open.

4. The solar module as claimed in claim 1, wherein the actuation circuit is configured to vary a frequency of the clocked actuation of the switch in a statistical manner.

5. A photovoltaic installation comprising a plurality of solar modules interconnected in series and/or in parallel, wherein at least one of the solar modules comprise:
a series circuit of a plurality of series-connected solar cells;
a switch arranged in parallel by itself with a first section of the series circuit, wherein the first section of the series circuit is the entire series circuit of the plurality of series-connected solar cells connected in series with a circuit breaker; and
an actuation circuit operably coupled to the switch, wherein the actuation circuit is configured to actuate the switch in a clocked manner with a duty cycle, wherein the duty cycle is based on a voltage dropped across the series circuit or across a second section of the series circuit, wherein the second section of the series circuit is less than the entire series circuit of the plurality of series-connected solar cells, wherein the circuit breaker is configured such that, when opened, the circuit breaker electrically isolates the first section of the series circuit from one of the terminals of the solar module.

6. The photovoltaic installation as claimed in claim 5, further comprising an inverter configured to detect the clocked actuation of the switch of the at least one of the solar modules as a frequency signal on a connection line for the plurality of solar modules, wherein the inverter is configured to shift an operating point of the plurality of solar modules to a higher current on the connection line, in response to detection of the frequency signal.

* * * * *